United States Patent
Mori et al.

(10) Patent No.: US 11,713,517 B2
(45) Date of Patent: Aug. 1, 2023

(54) GROUP-III NITRIDE SUBSTRATE

(71) Applicant: Panasonic Corporation, Osaka (JP)

(72) Inventors: Yusuke Mori, Osaka (JP); Masashi Yoshimura, Osaka (JP); Masayuki Imanishi, Osaka (JP); Akira Kitamoto, Osaka (JP); Junichi Takino, Osaka (JP); Tomoaki Sumi, Osaka (JP); Yoshio Okayama, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 175 days.

(21) Appl. No.: 17/023,720

(22) Filed: Sep. 17, 2020

(65) Prior Publication Data

US 2021/0087707 A1 Mar. 25, 2021

(30) Foreign Application Priority Data

Sep. 24, 2019 (JP) .................................. 2019-172644

(51) Int. Cl.
  *C30B 29/40* (2006.01)
  *C30B 33/08* (2006.01)
  *C30B 25/02* (2006.01)

(52) U.S. Cl.
  CPC ............ *C30B 29/406* (2013.01); *C30B 33/08* (2013.01); *C30B 25/02* (2013.01)

(58) Field of Classification Search
  CPC ...... C30B 29/605; C30B 29/66; C30B 29/403; C30B 29/406; C30B 29/40; C30B 33/08; C30B 25/02; H01L 29/06; H01L 29/0603; H01L 29/0684; H01L 29/2003

USPC ........ 438/479; 117/101, 104, 91, 94, 95, 96; 257/101; 252/62.3 GA
See application file for complete search history.

(56) References Cited

U.S. PATENT DOCUMENTS

| | | | | |
|---|---|---|---|---|
| 2005/0092234 A1* | 5/2005 | Motoki | ................... | C30B 25/18 117/91 |
| 2018/0114692 A1* | 4/2018 | Kitamura | ................ | C30B 25/20 |

FOREIGN PATENT DOCUMENTS

| | | | | |
|---|---|---|---|---|
| EP | 2402486 A1 * | 1/2012 | ............. | C30B 19/02 |
| JP | 2010037185 A * | 2/2010 | ............. | C30B 25/02 |
| JP | 2010-132558 | 6/2010 | | |

OTHER PUBLICATIONS

Machine translation of JP 2010037185 A originally published Feb. 2010 to Horii et al. (Year: 2010).*
Office Action dated Apr. 20, 2021 in Japanese Patent Application No. 2019-172644, with English-language machine translation.
Sumi, Tomoaki, "Long term, high-speed growth technology for GaN crystals using the OVPE method", Osaka University Knowledge Archive, Jan. 2015, pp. 1-34, doi:10.18910/52185, with English-language translation.

* cited by examiner

*Primary Examiner* — Coris Fung
*Assistant Examiner* — Ritu S Shirali
(74) *Attorney, Agent, or Firm* — Wenderoth, Lind & Ponack, L.L.P.

(57) ABSTRACT

A group-III nitride substrate includes: a first region having a first impurity concentration in a polished surface; and a second region having a second impurity concentration lower than the first impurity concentration in the polished surface, wherein a first dislocation density of the first region is lower than a second dislocation density of the second region.

5 Claims, 12 Drawing Sheets

GROUP-III NITRIDE SUBSTRATE

CROSS-REFERENCE TO RELATED APPLICATIONS

This application claims a priority of Japanese Patent Application No. 2019-172644 filed on Sep. 24, 2019, the contents of which is incorporated herein by reference.

BACKGROUND OF THE INVENTION

1. Field of the Invention

The present invention relates to a group-III nitride substrate.

2. Description of the Related Art

A vertical GaN power device conventionally requires a low-resistance and low-dislocation GaN substrate. For example, when an n-type low-resistance GaN substrate is formed, a mixed amount of Si atoms or O atoms is increased to increase a carrier concentration (see, e.g., Japanese Laid-Open Patent Publication No. 2010-132558).

However, GaN substrate having a high carrier concentration of $1\times10^{20}/cm^3$ or more may cause problems such as deterioration of crystallinity and increase of dislocation defects.

SUMMARY

It is therefore one non-limiting and exemplary embodiment provides a low-dislocation and low-resistance group-III nitride substrate while achieving a high carrier concentration.

In one general aspect, the techniques disclosed here feature: a group-III nitride substrate having a polished surface, the group-III nitride substrate includes:

a first region having a first impurity concentration in the polished surface; and a second region having a second impurity concentration lower than the first impurity concentration in the polished surface, wherein a first dislocation density of the first region is lower than a second dislocation density of the second region.

The group-III nitride substrate of the present invention has low dislocation and low resistance and can suppress occurrence of leakage in the second region having a high dislocation density at the time of device formation, thereby improving a dielectric strength voltage.

Additional benefits and advantages of the disclosed embodiments will be apparent from the specification and figures. The benefits and/or advantages may be individually provided by the various embodiments and features of the specification and drawings disclosure, and need not all be provided in order to obtain one or more of the same.

BRIEF DESCRIPTION OF THE DRAWINGS

The present disclosure will become readily understood from the following description of non-limiting and exemplary embodiments thereof made with reference to the accompanying drawings, in which like parts are designated by like reference numeral and in which.

DETAILED DESCRIPTION

A group-III nitride substrate according to a first aspect, having a polished surface, the group-III nitride substrate includes:

a first region having a first impurity concentration in the polished surface; and a second region having a second impurity concentration lower than the first impurity concentration, in the polished surface, wherein a first dislocation density of the first region is lower than a second dislocation density of the second region.

The group-III nitride substrate according to a second aspect, in the first aspect, wherein the first region is one of first regions arranged around the second region to surround the second region.

The group-III nitride substrate according to a third aspect, in the first aspect, wherein the first region has a shape having a width that narrows toward the second regions.

The group-III nitride substrate according to a fourth aspect, in the first aspect, further comprising a third region having a third impurity concentration lower than the second impurity concentration.

The group-III nitride substrate according to a fifth aspect, in the fourth aspect, wherein the third region is one of third regions arranged around the second region to surround the second region.

The group-III nitride substrate according to a sixth aspect, in the fourth aspect, wherein the first regions and the third regions are alternately arranged circumferentially around the second region.

The group-III nitride substrate according to a seventh aspect, in the first aspect, wherein an impurity contained in the first region is at least one selected from the group consisting of oxygen and silicon.

The group-III nitride substrate according to an eighth aspect, in the first aspect, wherein the first impurity concentration is an oxygen concentration of $1\times10^{20}/cm^3$ or more.

A device according to a ninth aspect, the device includes:

the group-III nitride substrate according to first aspect; and a device structure formed on the group-III nitride substrate.

A group-III nitride substrate according to an embodiment will now be described with reference to the accompanying drawings. In the drawings, substantially the same members are denoted by the same reference numerals.

First Embodiment

<Group-III Nitride Substrate>

Figure 1:
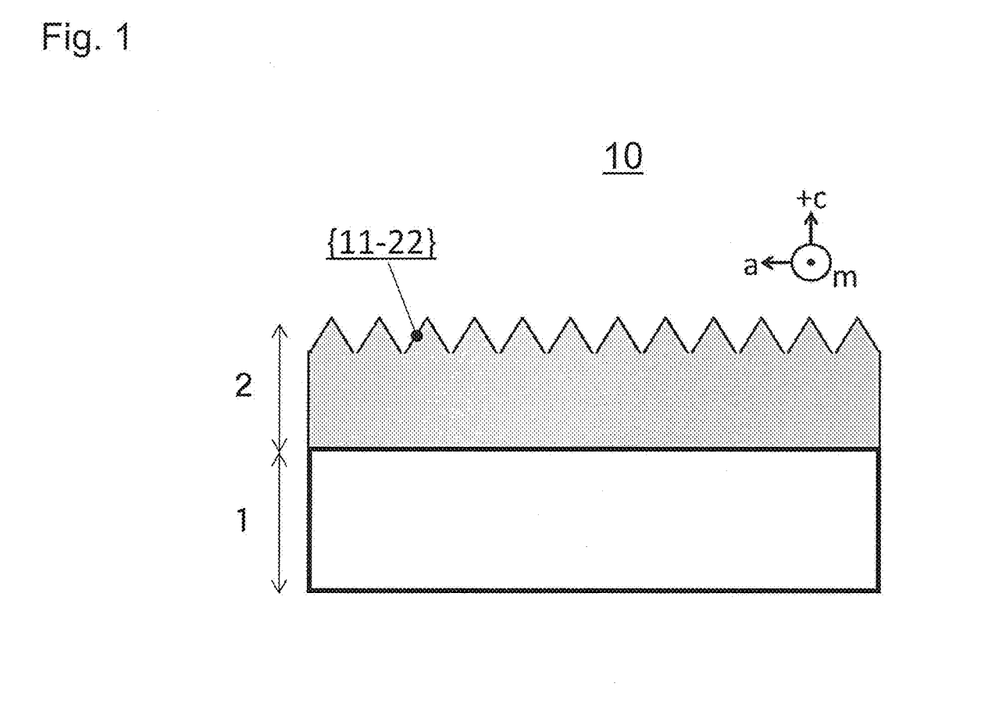
FIG. 1 is a cross-sectional view of a group-III nitride substrate according to a first embodiment as viewed from an m-plane.
Figure 2:
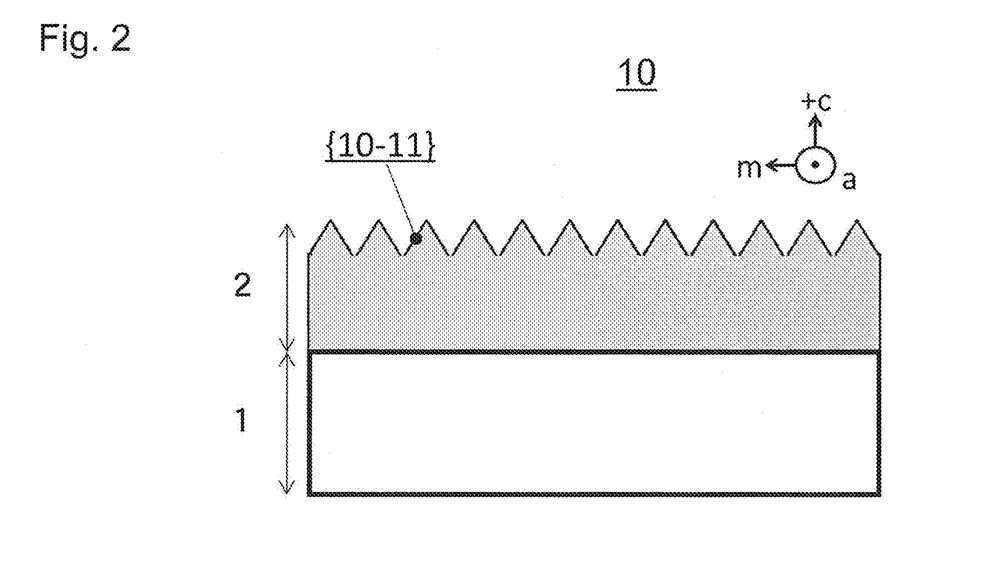
FIG. 2 is a cross-sectional view of the group-III nitride substrate according to the first embodiment as viewed from an a-plane.
Figure 3:
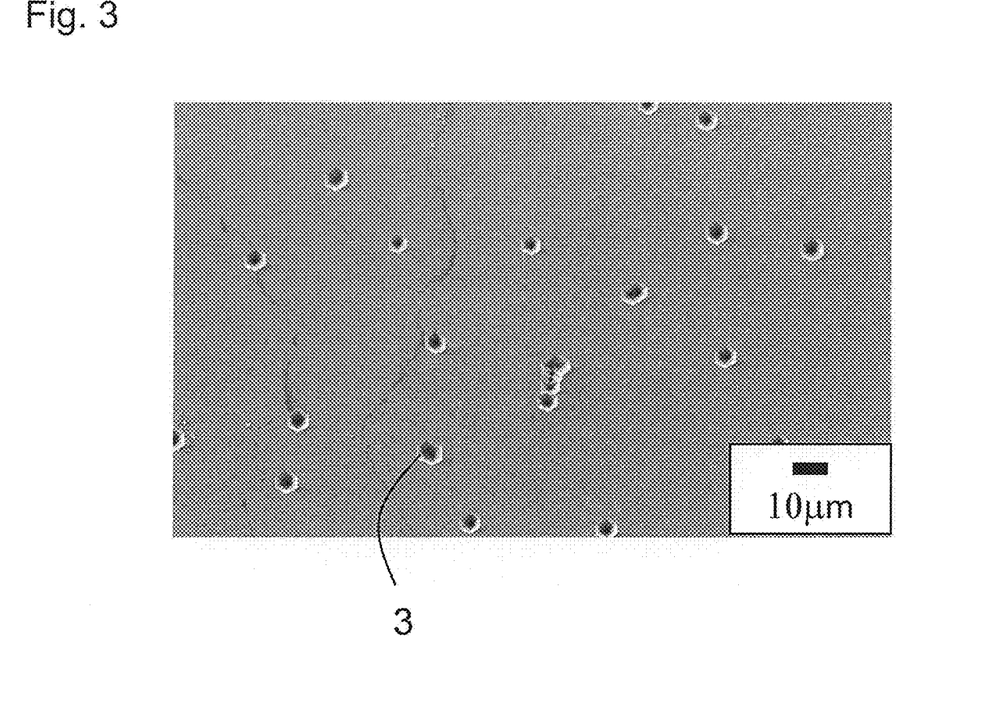
FIG. 3 is a scanning electron micrograph showing a distribution of etch pits after surface polishing and etching of a surface of the group-III nitride substrate according to the first embodiment.
Figure 4:
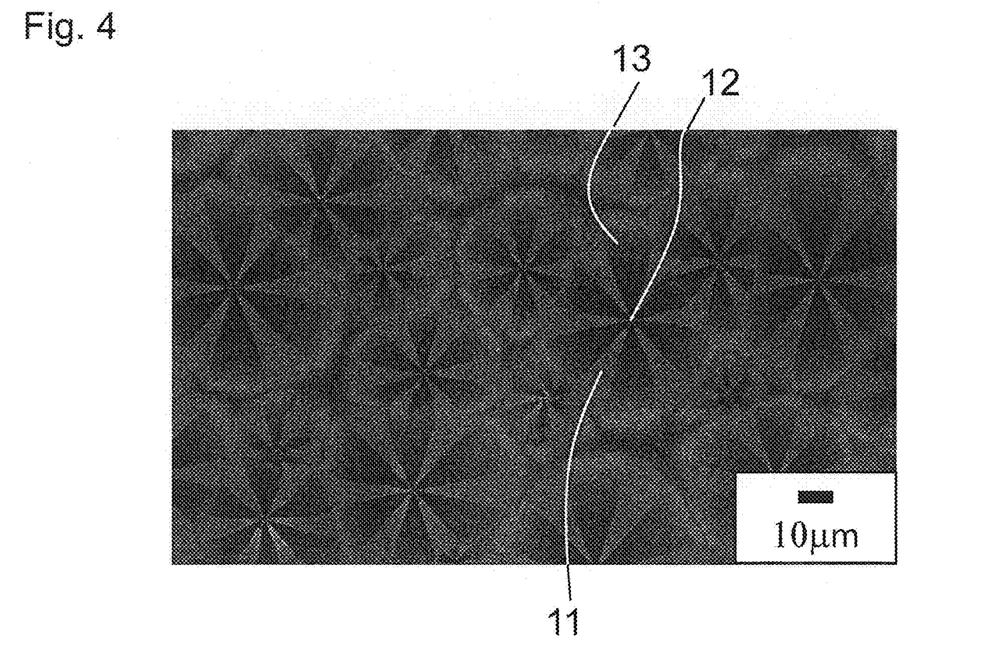
FIG. 4 is a cathodoluminescence (CL) image showing surface dislocation as viewed from a c-axis of the group-III nitride substrate of FIG. 3.

FIG. 1 is a cross-sectional view of a group-III nitride substrate according to a first embodiment as viewed from an m-plane. FIG. 2 is a cross-sectional view of the group-III nitride substrate according to the first embodiment as viewed from an a-plane. FIG. 3 is a scanning electron micrograph showing a distribution of etch pits 3 after surface polishing and etching of a surface of the group-III nitride substrate according to the first embodiment. FIG. 4 is a cathodoluminescence (CL) image showing surface dislocation as viewed from a c-axis of the group-III nitride substrate of FIG. 3.

For example, as shown in FIGS. 1 and 2, the group-III nitride substrate according to the first embodiment has a GaN layer 2 grown on a seed substrate 1, when polished, the group-III nitride substrate has a polished surface of GaN layer 2. As shown in the cross-sectional view when viewed from the m-plane of FIG. 1, the surface of the GaN layer 2 has a {11-22} plane in the polished surface. As shown in the cross-sectional view when viewed from the a-plane of FIG. 2, the surface also has a {10-11} plane in the polished surface. As shown in the SEM photograph of FIG. 3 and the cathodoluminescence image after surface polishing of FIG. 4, six each of first regions 11 of the {11-22} plane and third regions 13 of the {10-11} plane are arranged to surround a second region 12 that is an etch pit. The first regions 11 and the third regions 13 are alternately arranged around the second region 12. Each of the first regions 11 and the third regions 13 has a width that narrows toward the second region 12 surrounded by the first regions 11 and the third regions 13. The width is perpendicular to the direction toward the second region 12. In other words, the first regions 11 and the third regions 13 extend radially around the second region 12. The first regions 11 and the third regions 13 are arranged around each of second regions 12 that are etch pits.

As shown in the SEM photograph of FIG. 3, it can be seen that the density of the etch pits 3 is low, i.e., the dislocation density is low, in the surface of the group-III nitride substrate according to the first embodiment.

<Impurity Concentration>

Figure 5:
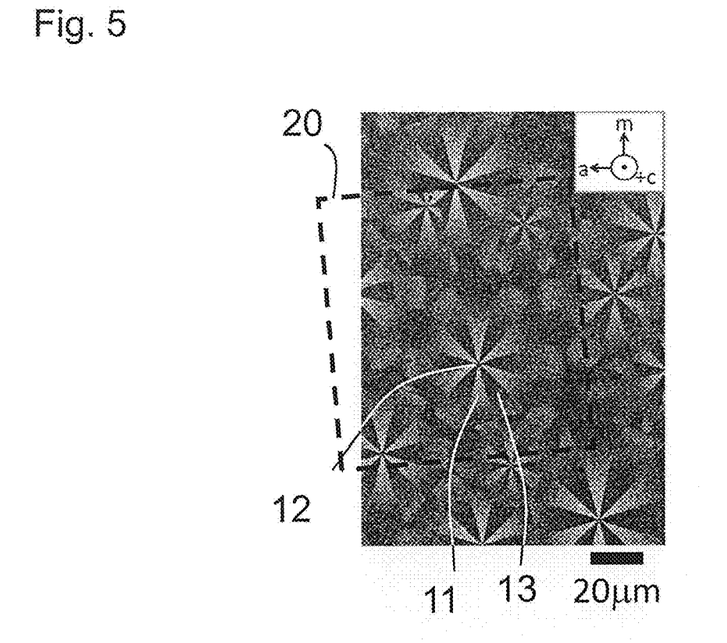
FIG. 5 is a cathodoluminescence (CL) image showing a surface dislocation as viewed from the c-axis of the group-III nitride substrate, showing an analysis range of secondary ion mass spectrometry.
Figure 6:
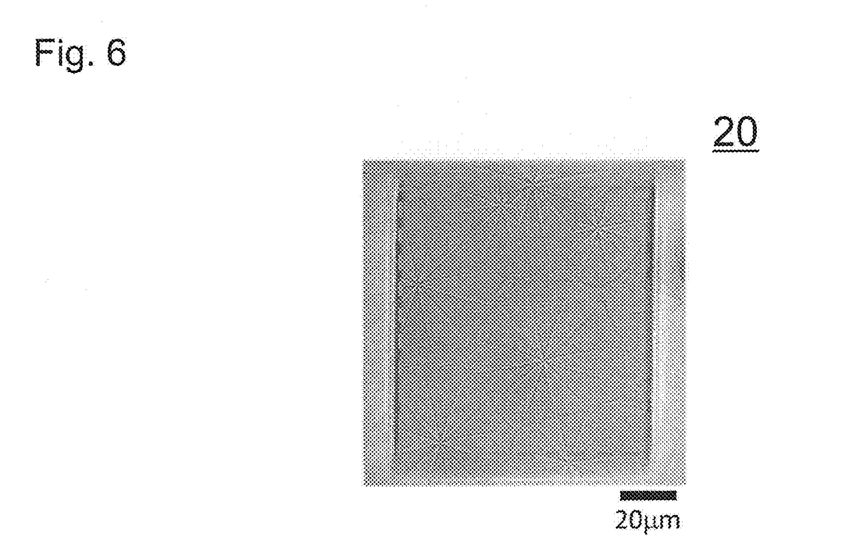
FIG. 6 is a microscope image of the analysis range of FIG. 5.
Figure 7:
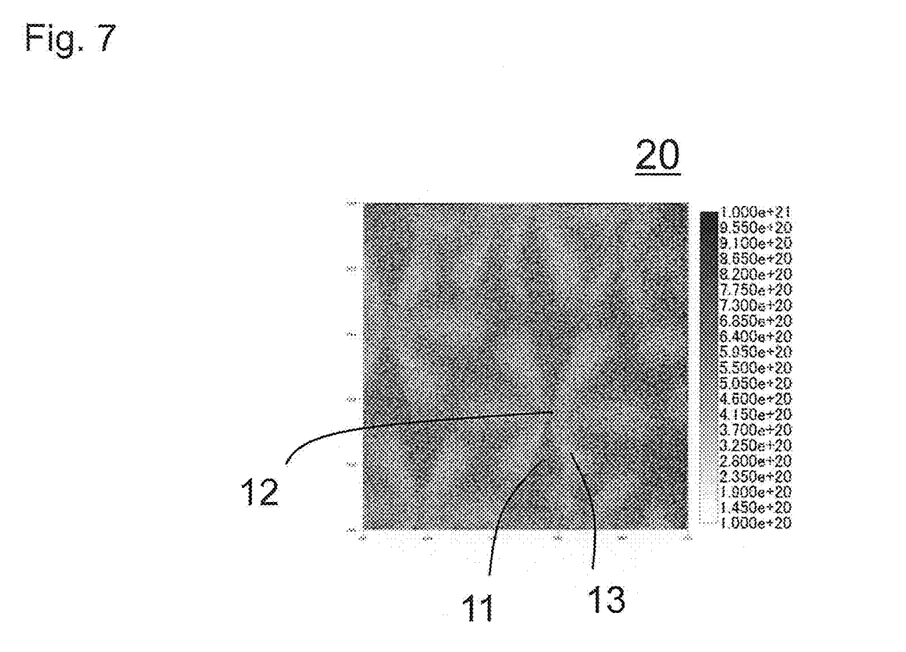
FIG. 7 is a diagram showing shading of oxygen concentration obtained by secondary ion mass spectrometry in the analysis range of FIG. 5.
Figure 8:
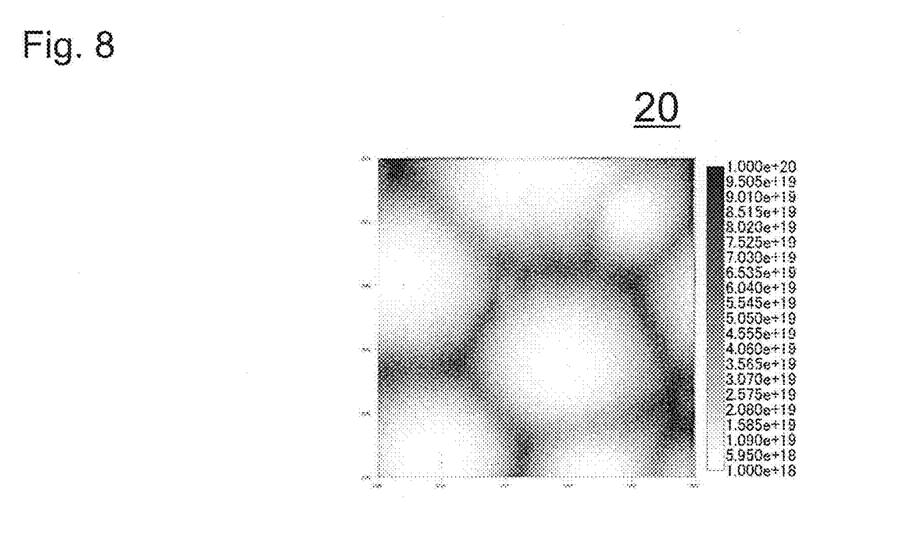
FIG. 8 is a diagram showing shading of Si concentration obtained by secondary ion mass spectrometry in the analysis range of FIG. 5.

FIG. 5 is a cathodoluminescence (CL) image showing a surface dislocation as viewed from the c-axis of the group-III nitride substrate, showing an analysis range 20 of secondary ion mass spectrometry. FIG. 6 is a microscope image of the analysis range of FIG. 5. FIG. 7 is a diagram showing shading of an oxygen concentration obtained by secondary ion mass spectrometry in the analysis range of FIG. 5. FIG. 8 is a diagram showing shading of Si concentration obtained by secondary ion mass spectrometry in the analysis range of FIG. 5.

In this group-III nitride substrate, for example, as shown in FIG. 7, the oxygen concentration of the first regions 11 is in the latter half of the order of $10^{20}/cm^2$, while the oxygen concentration of the third regions 13 is in the first half of the order of $10^{20}/cm^2$. Therefore, the oxygen concentration of the first regions 11 is higher than the oxygen concentration of the third regions 13. It can also be seen that the oxygen concentration of the second regions 12 is lower than that of the first regions 11 and higher than that of the third regions 13. A first dislocation density of the first regions 11 is lower than a second dislocation density of the second regions 12. As shown in FIG. 8, the Si concentration is in a range from the first half on the order $10^{18}/cm^2$ to the latter half of the order of $10^{19}/cm^2$ over the first regions 11, the second regions 12, and the third regions 13 and is not significantly different among the regions, and the difference in impurity concentration depends on an oxygen concentration.

<Thickness and Dislocation Density of Growth Layer>

Figure 9:
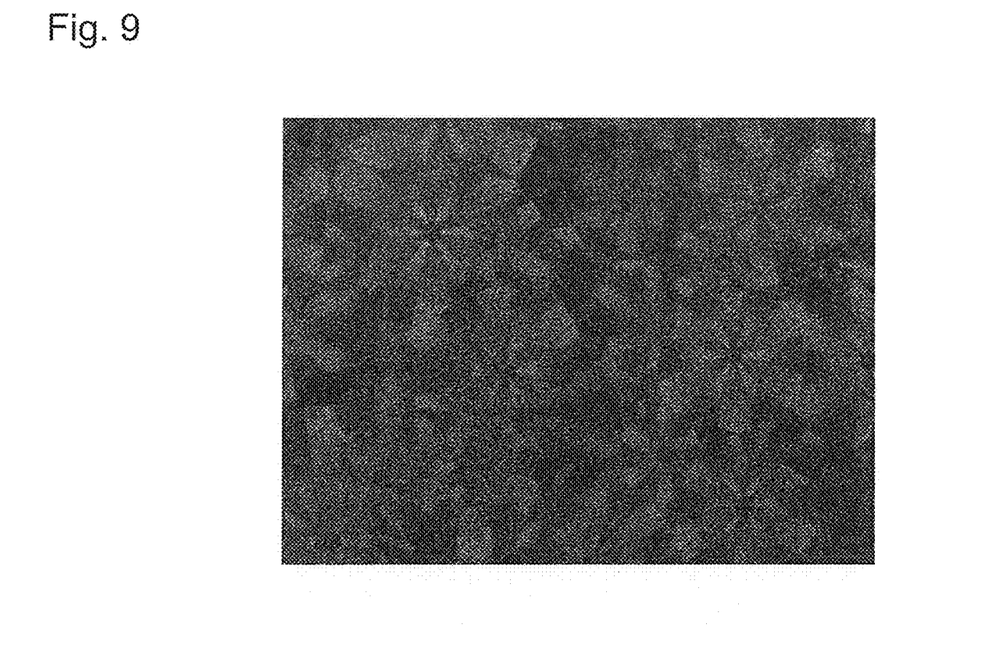
FIG. 9 is a cathodoluminescence (CL) image showing surface dislocation as viewed from the c-axis of the group-III nitride substrate when an OVPE-GaN layer has a thickness of 50 μm.
Figure 10:
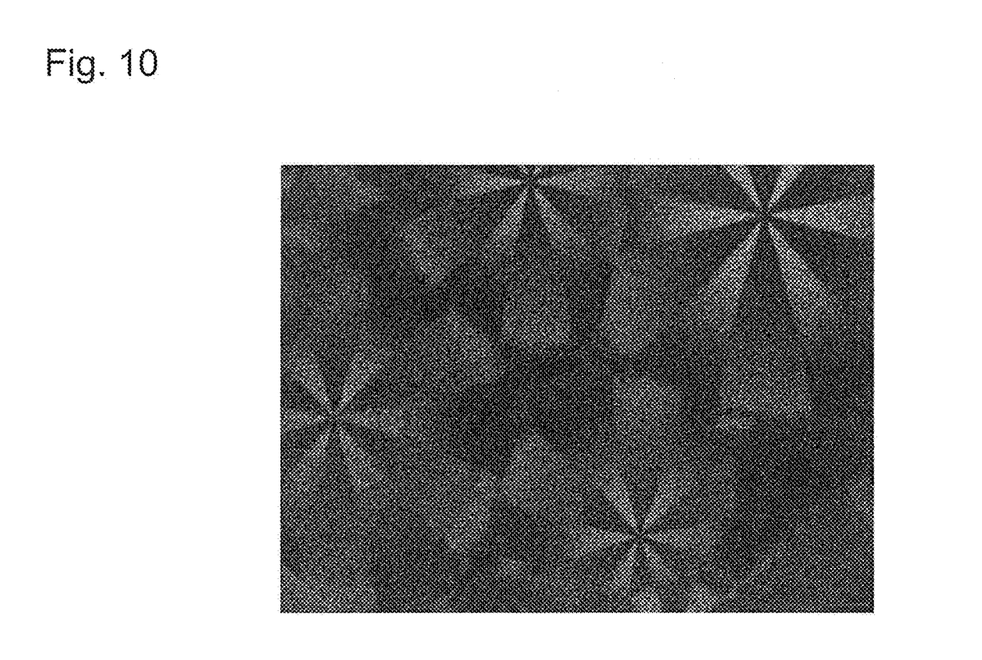
FIG. 10 is a cathodoluminescence (CL) image showing surface dislocation as viewed from the c-axis of the group-Ili nitride substrate when the OVPE-GaN layer has a thickness of 200 μm.
Figure 11:
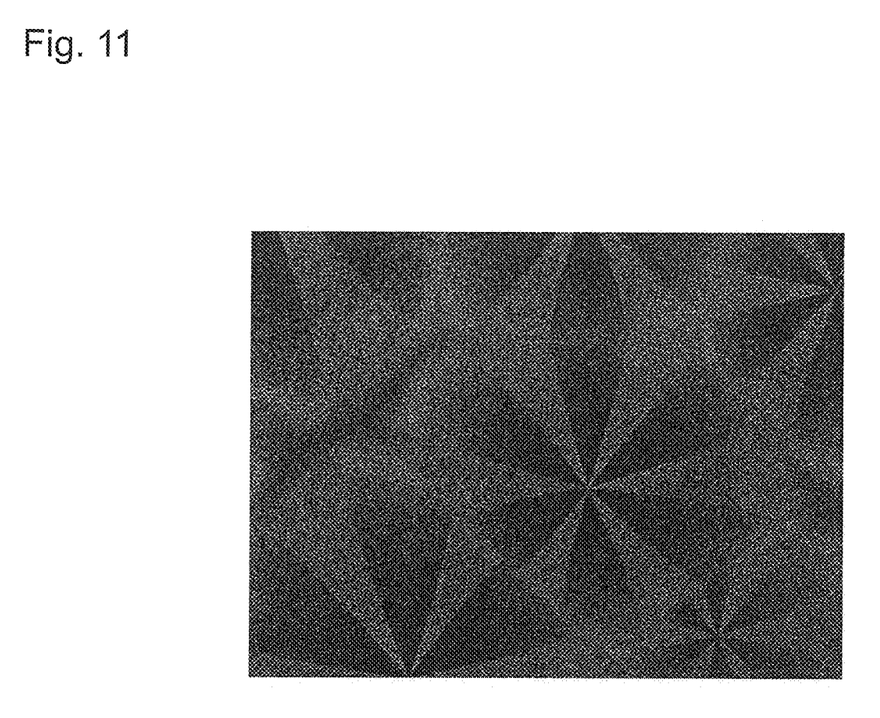
FIG. 11 is a cathodoluminescence (CL) image showing surface dislocation as viewed from the c-axis of the group-III nitride substrate when the OVPE-GaN layer has a thickness of 300 μm.
Figure 12:
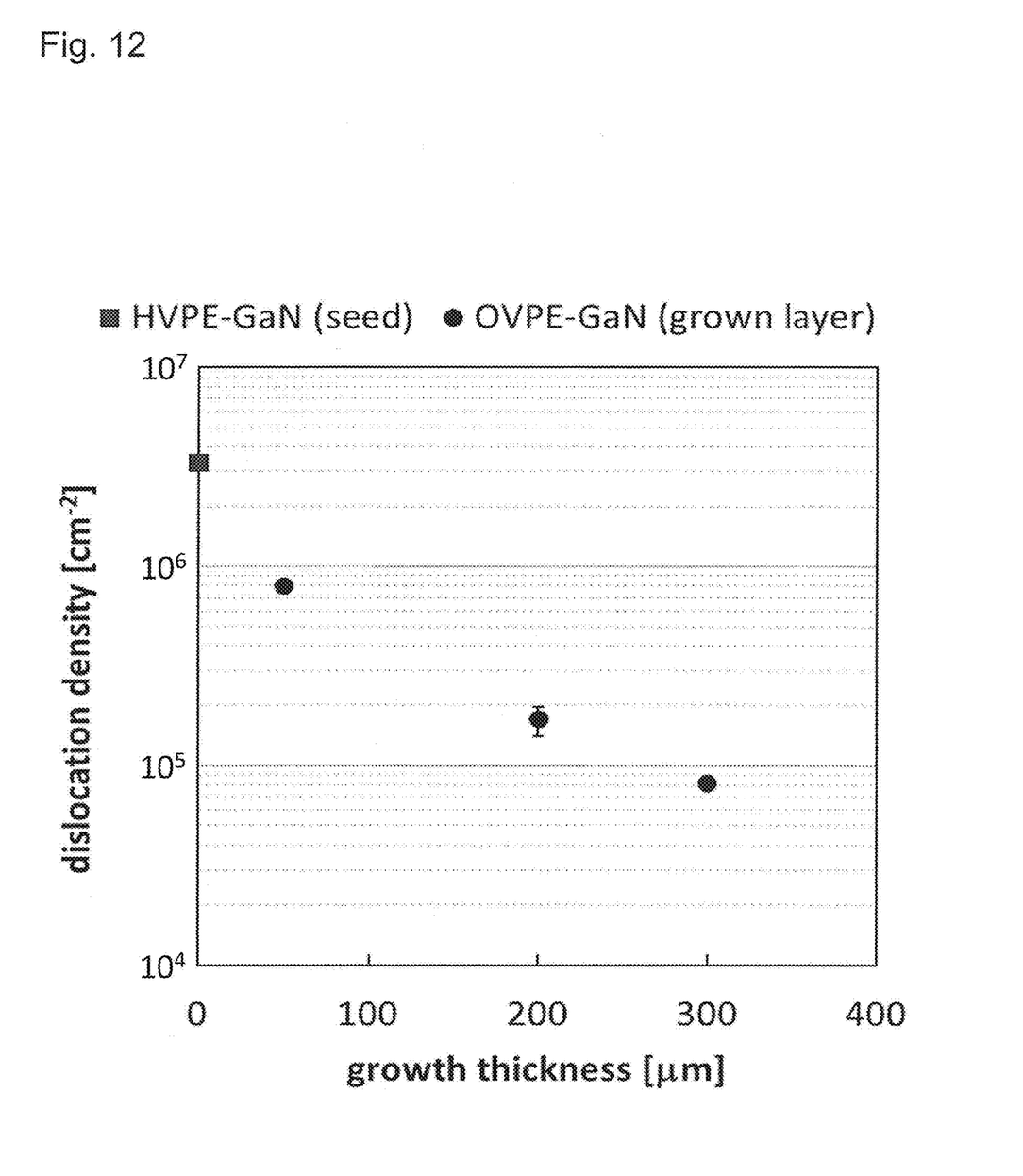
FIG. 12 is a diagram showing a relationship between the thickness of the OVPE-GaN layer and a dislocation density.

FIG. 9 is a cathodoluminescence (CL) image showing surface dislocation as viewed from the c-axis of the group-III nitride substrate when an OVPE-GaN layer has a thickness of 50 μm. FIG. 10 is a cathodoluminescence (CL) image showing surface dislocation as viewed from the c-axis of the group-III nitride substrate when the OVPE-GaN layer has a thickness of 200 μm. FIG. 11 is a cathodoluminescence (CL) image showing surface dislocation as viewed from the c-axis of the group-III nitride substrate when the OVPE-GaN layer has a thickness of 300 μm. FIG. 12 is a diagram showing a relationship between the thickness of the OVPE-GaN layer and a dislocation density.

As shown in FIGS. 9 to 11, it can be seen that the number of the second regions 12 decreases as the thickness of the GaN layer 2, i.e., a growth layer, of FIGS. 1 and 2 increases. In other words, as shown in FIG. 12, it can be seen that the dislocation density decreases as the thickness of the GaN layer 2 grown on the seed substrate 1 increases. Specifically, while the dislocation density is as high as about $3\times10^6$ cm$^{-2}$ in the case of HVPE-GaN of the seed substrate 1, the dislocation density decreases to about $1.5\times10^5$ cm$^{-2}$ and about $8\times10^4$ cm$^{-2}$ when the thickness of the GaN layer 2 is 200 μm and 300 μm, respectively. Considering the dislocation density, the thickness of the GaN layer 2 is preferably about 200 μm or more. Furthermore, the thickness of the GaN layer 2 is more preferably 300 μm or more.

Figure 13:
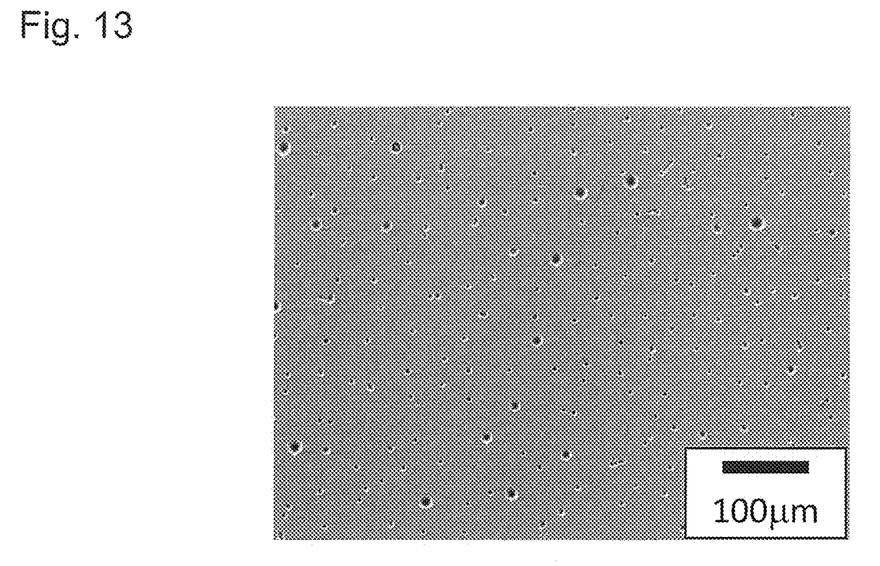
FIG. 13 is a scanning electron micrograph showing a distribution of etch pits after surface polishing and etching of the surface of the OVPE-GaN layer having the dislocation density of $6.2\times10^4$ $cm^2$.
Figure 14:
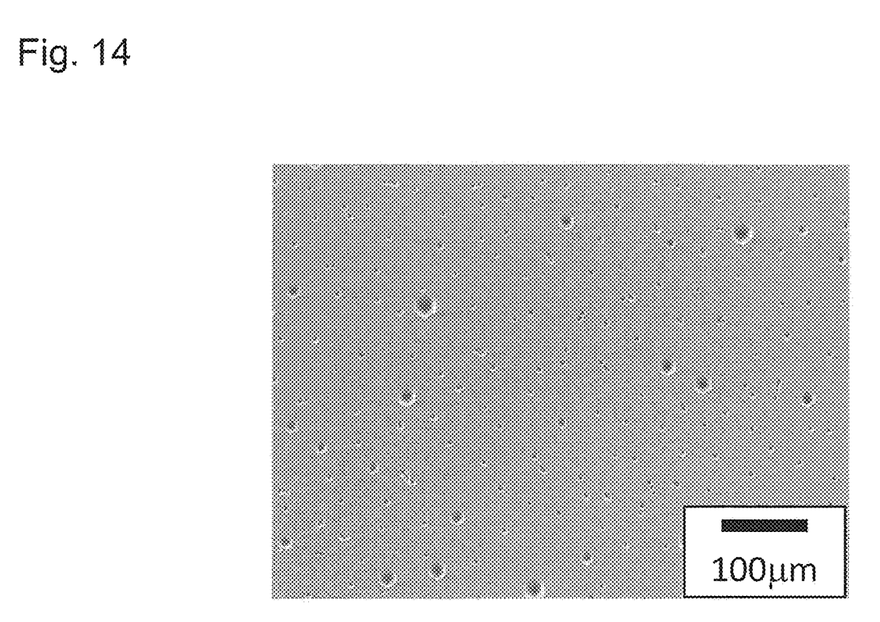
FIG. 14 is a scanning electron micrograph showing a distribution of etch pits after surface polishing and etching of the surface of the OVPE-GaN layer having the dislocation density of $6.4\times10^4$ $cm^2$.
Figure 15:
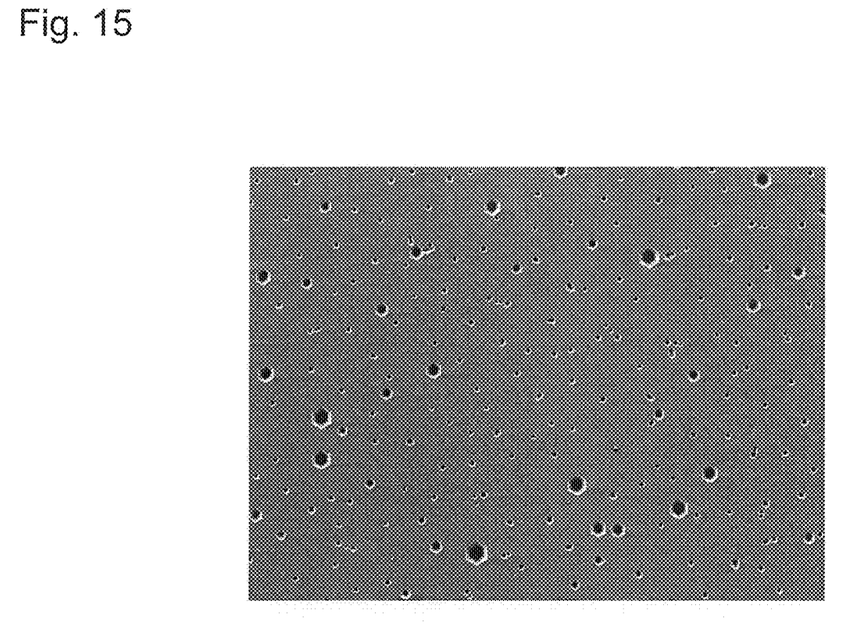
FIG. 15 is a scanning electron micrograph showing a distribution of etch pits after surface polishing and etching of the surface of the OVPE-GaN layer having the dislocation density of $5.7\times10^4$ $cm^2$.
Figure 16:
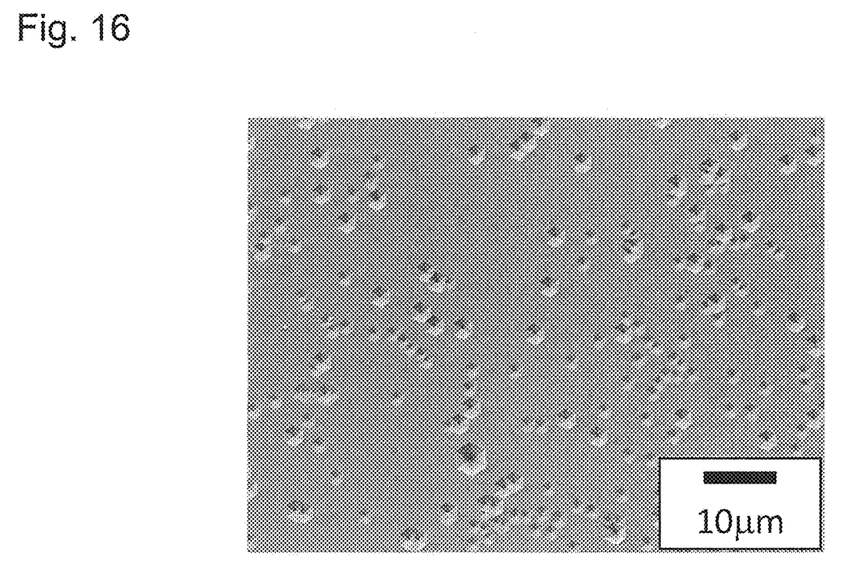
FIG. 16 is a scanning electron micrograph showing a distribution of etch pits after surface polishing and etching of the surface of the HVPE-GaN layer having the dislocation density of $4.3\times10^6/cm^2$.

FIG. 13 is a scanning electron micrograph showing a distribution of etch pits after surface polishing and etching of the surface of the OVPE-GaN layer having the dislocation density of $6.2\times10^4$/cm$^2$. FIG. 14 is a scanning electron micrograph showing a distribution of etch pits after surface polishing and etching of the surface of the OVPE-GaN layer having the dislocation density of $6.4\times10^4$/cm$^2$. FIG. 15 is a scanning electron micrograph showing a distribution of etch pits after surface polishing and etching of the surface of the OVPE-GaN layer having the dislocation density of $5.7\times10^4$ cm$^2$. FIG. 16 is a scanning electron micrograph showing a distribution of etch pits after surface polishing and etching of the surface of the HVPE-GaN layer having the dislocation density of $4.3\times10^6$/cm$^2$.

As shown in FIG. 16, the surface of the GaN layer acquired by an HVPE method (hydride vapor phase epitaxy method) on the seed substrate 1 has an extremely high dislocation density. On the other hand, by disposing the GaN layer 2 grown by an OVPE method (oxide vapor phase epitaxy method) on the seed substrate 1, the dislocation density can be reduced by about two orders of magnitude as shown in FIGS. 12 to 15.

This group-III nitride substrate has low dislocation and low resistance. Therefore, even when a device is formed thereon, electricity can preferentially be applied to the first regions having a low resistance by increasing the impurity concentration in the first regions having a low dislocation density. This can suppress occurrence of leakage in the second regions having a high dislocation density and can improve a dielectric strength voltage.

<Overview of Manufacturing Method of Group-III Nitride Substrate>

Figure 17:
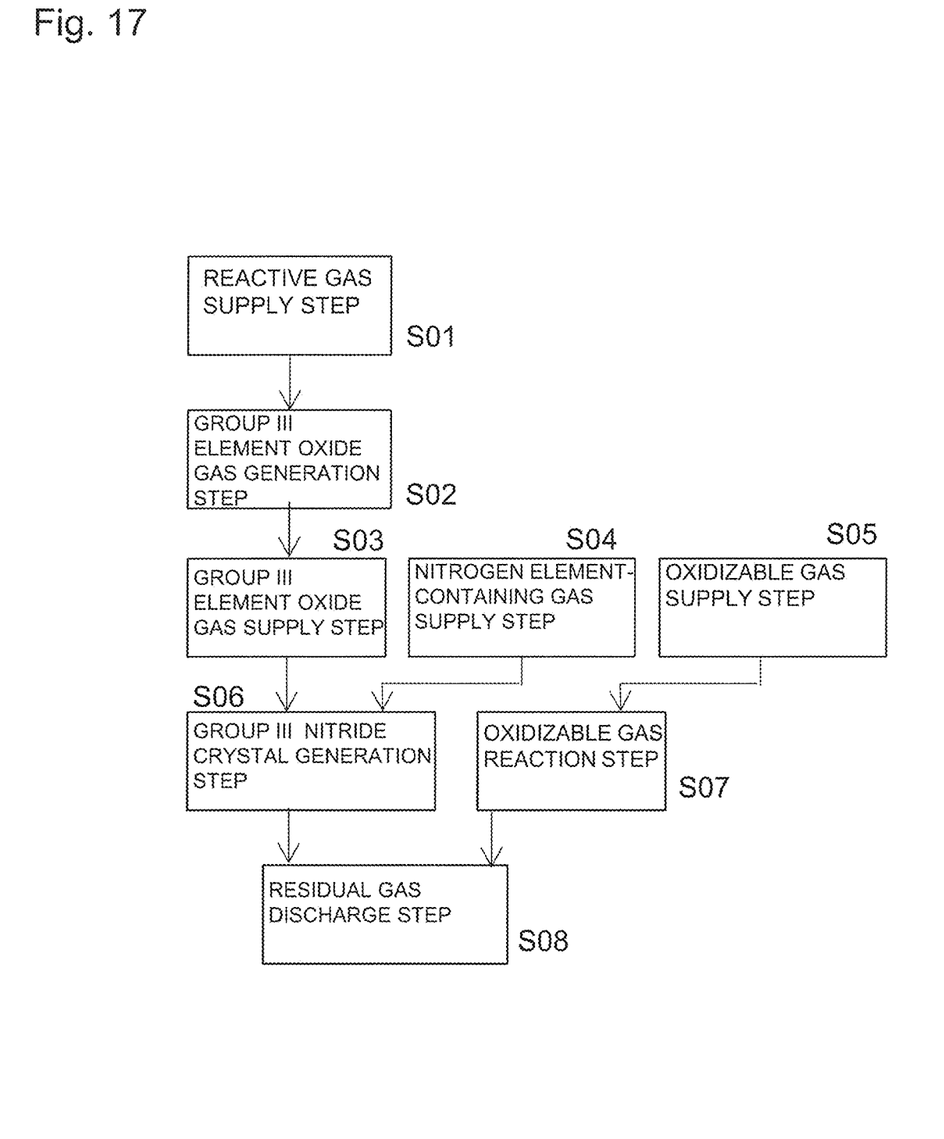
FIG. 17 is a flowchart of a manufacturing method of the group-III nitride substrate according to the first embodiment.

An overview of a manufacturing method of the group-III nitride substrate according to the first embodiment of the present disclosure will be described with reference to a flowchart of FIG. 17. The manufacturing method of the group-III nitride substrate according to the first embodiment includes a reactive gas supply step (S01), a group-III element oxide gas generation step (S02), a group-III element oxide gas supply step (S03), a nitrogen element-containing gas supply step (S04), an oxidizable gas supply step (S05), a group-III nitride crystal generation step (S06), an oxidizable gas reaction step (S07), and a residual gas discharge step (S08). This manufacturing method of the group-III nitride substrate is characterized in that a GaN layer is grown by an OVPE method using a group-III element oxide gas as a raw material.

(1) At the reactive gas supply step, a reactive gas is supplied to a raw material reaction chamber (S01).

(2) At the group-III element oxide gas generation step, a starting group-III element source is reacted with a reactive gas (a reducing gas when the starting group-III element source is an oxide, or an oxidizing gas when the source is a metal) to generate a group-III element oxide gas (S02).

(3) At the group-III element oxide gas supply step, the group-III element oxide gas manufactured at the group-III element oxide gas generation step is supplied to a growth chamber (S03).

(4) At the nitrogen element-containing gas supply step, a nitrogen element-containing gas is supplied to the growth chamber (S04).

(5) At the oxidizable gas supply step, an oxidizable gas is supplied to the growth chamber (S05).

(6) At the group-III nitride crystal generation step, the group-III element oxide gas supplied into the growth chamber at the group-III element oxide gas supply step is reacted with the nitrogen element-containing gas supplied into the growth chamber at the nitrogen element-containing gas supply step to generate a group-III nitride crystal (S06).

(7) At the oxidizable gas reaction step, an oxide other than the group-III element oxide gas supplied into the growth chamber is reacted with the oxidizable gas to prevent oxygen from mixing into the group-III nitride crystal (S07).

(8) At the residual gas discharge step, an unreacted gas not contributing to the generation of the group-III nitride crystal is discharged out of the chamber (S08).

Through the steps described above, the group-III nitride substrate having a group-III nitride crystal grown on a seed substrate can be generated.

<Overview of Manufacturing Apparatus of Group-III Nitride Substrate>

An overview of a manufacturing apparatus 150 of the group-III nitride substrate according to the first embodiment of the present disclosure will be described with reference to schematics showing a configuration of the manufacturing apparatus 150 of the group-III nitride substrate of FIGS. 18 and 19.

Figure 18:
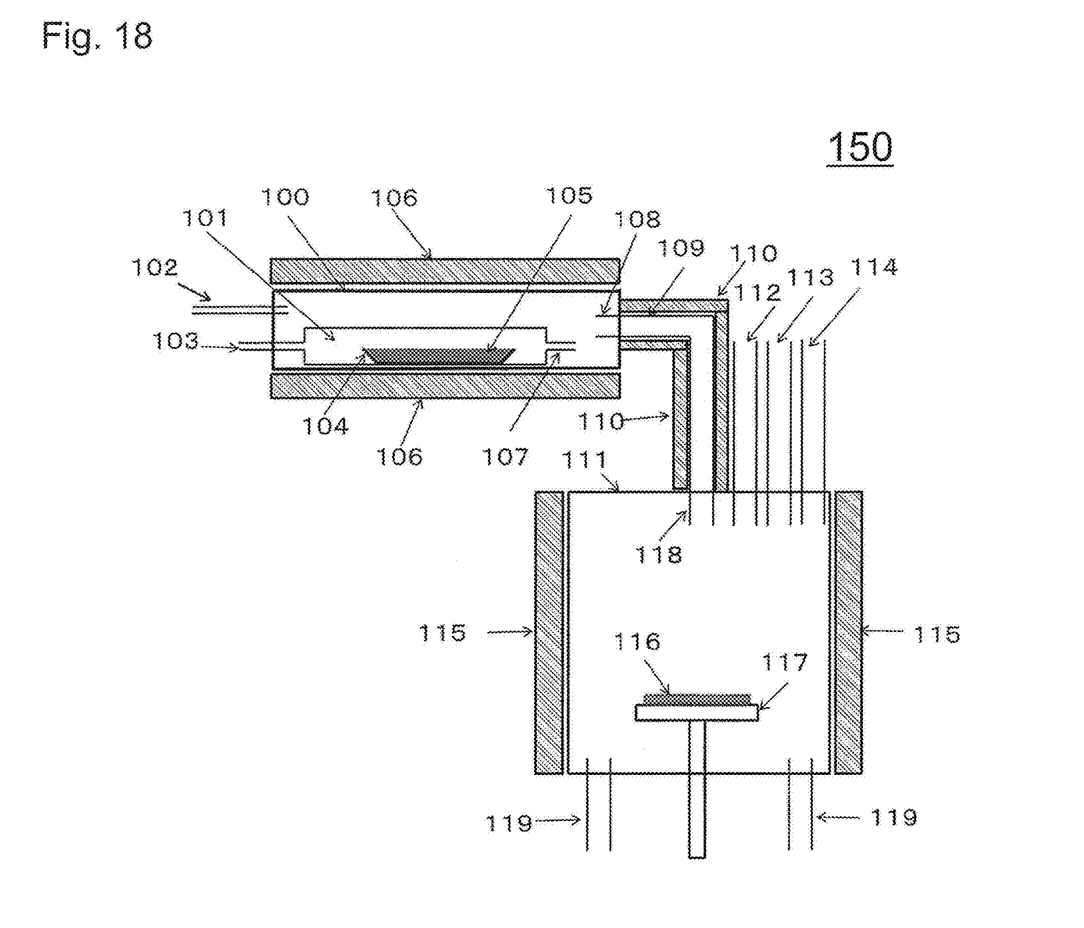
FIG. 18 is a schematic showing a configuration of a manufacturing apparatus of the group-III nitride substrate according to the first embodiment.
Figure 19:
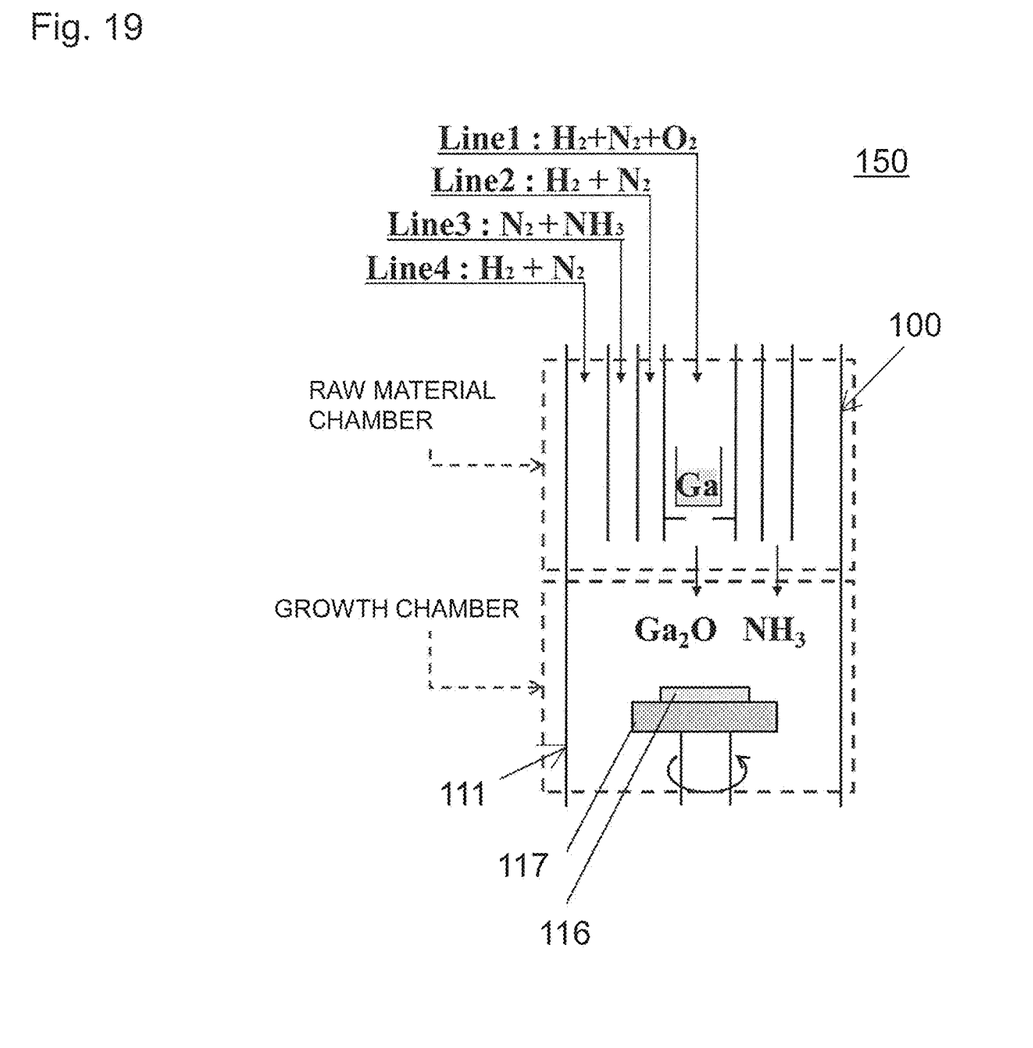
FIG. 19 is a schematic showing a modification of the manufacturing apparatus of the group-III nitride substrate of FIG. 18.

It is noted that constituent members shown in FIGS. 18 and 19 may be different from actual members in terms of size, ratio, etc. In the manufacturing apparatus 150 of the group-III nitride crystal according to the first embodiment, a raw material reaction chamber 101 is disposed in a raw material chamber 100, and a raw material boat 104 with a starting group-III element source 105 placed therein is disposed in the raw material reaction chamber 101. A reactive gas supply pipe 103 supplying a gas reactive with the starting group-III element source 105 is connected to the raw material reaction chamber 101, and the raw material reaction chamber 101 has a group-III oxide gas discharge port 107. The reactive gas is a reducing gas when the starting group-III source is an oxide or an oxidizing gas when the source is a metal. The raw material chamber 100 includes a first carrier gas supply port 102, and the group-III oxide gas and a carrier gas flow from a group-III oxide gas and carrier gas discharge port 108 through a connection pipe 109 into a growth chamber 111. The growth chamber 111 has a group-III oxide gas and carrier gas supply port 118, an oxidizable gas supply port 113, a nitrogen element-containing gas supply port 112, a second carrier gas supply port 114, and an exhaust port 119 and includes a substrate susceptor 117 on which a seed substrate 116 is disposed.

<Details of Manufacturing Method and Manufacturing Apparatus>

The details of the manufacturing method of the group-III nitride substrate according to the first embodiment will be described with reference to FIGS. 18 and 19.

A metal Ga is used as the starting group-III element source 105 in this description.

(1) At the reactive gas supply step, the reactive gas is supplied from the reactive gas supply pipe 103 to the raw material reaction chamber 101.

(2) At the group-III element oxide gas generation step, the reactive gas supplied to the raw material reaction chamber 101 at the reactive gas supply step reacts with the metal Ga serving as the starting group-III element source 105 to generate a $Ga_2O$ gas that is the group-III oxide gas. The generated $Ga_2O$ gas is discharged from the raw material reaction chamber 101 through the group-III oxide gas discharge port 107 to the raw material chamber 100. The discharged Ga$_2$O gas is mixed with a first carrier gas supplied from the first carrier gas supply port 102 to the raw material chamber and is supplied to the group-III oxide gas and carrier gas discharge port 108. At this step, a first heater 106 is set to a temperature equal to or greater than 800° C. from the viewpoint of the boiling point of the Ga$_2$O gas and less than 1800° C. so that the temperature is made lower than a second heater 115. A starting Ga source is placed in the raw material boat 104. The raw material boat 104 preferably has a shape capable of increasing a contact area between the reactive gas and the starting Ga source.

Methods of generating the group-III oxide gas are roughly classified into a method of reducing the starting Ga source 105 and a method of oxidizing the starting Ga source 105. For example, in the reducing method, an oxide (e.g., Ga$_2$O$_3$) is used as the starting Ga source 105, and a reducing gas (e.g., H$_2$ gas, CO gas, CH$_4$ gas, C$_2$H$_6$ gas, H$_2$S gas, SO$_2$ gas) is used as the reactive gas. On the other hand, in the oxidizing method, a non-oxide (e.g., liquid Ga) is used as the starting Ga source 105, and an oxidizing gas (e.g., H$_2$O gas, O$_2$ gas, CO gas) is used as the reactive gas. For example, a group-III oxide gas can be generated by Formula (I).

$$2Ga + H_2O \rightarrow Ga_2O + H_2 \quad (1)$$

In addition to the starting Ga source 105, an in source and an Al source can be employed as the starting group-III element. For the first carrier gas, an inert gas or H$_2$ gas is usable.

(3) At the group-III element oxide gas supply step, the Ga$_2$O gas generated at the group-III element oxide gas generation step is supplied through the group-III oxide gas and carrier gas discharge port 108, the connection pipe 109, and the group-III oxide gas and carrier gas supply port 118 to the growth chamber 111. When the temperature of the connection pipe 109 connecting the raw material chamber 100 and the growth chamber 111 is lower than the temperature of the raw material chamber 100, a reverse reaction of the reaction for generating the group-III oxide gas occurs, and the starting Ga source 105 precipitates inside the connection pipe 109. Therefore, the connection pipe 109 is heated by a third heater 110 to a temperature higher than the first heater 106 so as to prevent the temperature of the connection pipe 109 from becoming lower than the temperature of the raw material chamber 100.

(4) At the nitrogen element-containing gas supply step, the nitrogen element-containing gas is supplied from the nitrogen element-containing gas supply port 112 to the growth chamber 111. NH$_3$ gas, NO gas, NO$_2$ gas, N$_2$H$_2$ gas, N$_2$H$_4$ gas, etc. are usable as the nitrogen element-containing gas.

(5) At the oxidizable gas supply step, the oxidizable gas is supplied from the oxidizable gas supply port 113 to the growth chamber 111. The reason for supplying the oxidizable gas is to reduce an oxide gas other than the group-III oxide gas (the oxidizable gas reaction step). B gas, Ga gas, In gas, Tl gas, etc. are usable as the oxidizable gas from the viewpoint of reactivity with the oxide gas other than the Ga source. Additionally, CH$_4$ gas, C$_2$H$_6$ gas, C$_3$H$_8$ gas, C$_4$H$_{10}$ gas, C$_2$H$_4$ gas, C$_3$H$_6$ gas, C$_4$H$_8$ gas, C$_2$H$_2$ gas, C$_3$H$_4$ gas, HCN gas, etc. may be usable as the oxidizable gas.

(6) At the group-III nitride crystal generation step, the raw material gases supplied through the supply steps into the growth chamber are combined to manufacture a group-III nitride crystal. The growth chamber 111 is heated by the second heater 115 to a temperature at which the group-III oxide gas reacts with the nitrogen element-containing gas. In this case, the growth chamber 111 is heated to a temperature not lower than the temperature of the raw material chamber 100 so as to prevent the reverse reaction of the reaction for generating the group-III oxide gas. Therefore, the temperature of the second heater 115 is set to 1000° C. to 1800° C. The second heater 115 and the third heater 110 are set to the same temperature so as to suppress temperature fluctuations of the growth chamber 111 due to the Ga$_2$O gas generated in the raw material chamber 100 and the first carrier gas.

By mixing the group-III oxide gas supplied to the growth chamber 111 through the group-III element oxide gas supply step and the nitrogen element-containing gas supplied to the growth chamber 111 through the nitrogen element-containing gas supply step upstream of the seed substrate 116, the group-III nitride crystal can be grown on the seed substrate 116 by Formula (II).

$$Ga_2O + 2NH_3 \rightarrow 2GaN + H_2O + 2H_2 \quad (II)$$

In this case, to suppress decomposition of the nitrogen element-containing gas due to heat from the growth chamber 111, the nitrogen element-containing gas supply port 112 and an outer wall of the growth chamber 111 are preferably covered with a heat insulator.

Parasitic growth of the group-III nitride crystal onto a furnace wall of the growth chamber 111 and the substrate susceptor 117 is considered as a problem. Therefore, the concentrations of the group-III oxide gas and the nitrogen element-containing gas can be controlled by the carrier gas supplied from the second carrier gas supply port 114 to the growth chamber 111 to suppress the parasitic growth of the group-III nitride crystal onto the furnace wall of the growth chamber 111 and the substrate susceptor 117.

For the seed substrate 116, for example, gallium nitride, gallium arsenide, silicon, sapphire, silicon carbide, zinc oxide, gallium oxide, or ScAlMgO$_4$ is usable.

An inert gas or H$_2$ gas is usable as the second carrier gas.

Additionally, the oxidizable gas is supplied into the growth chamber 111 through the oxidizable gas supply step so as to reduce the oxygen concentration of the group-III nitride crystal. The oxide gas other than the Ga source supplied to the growth chamber 111 through the group-III oxide gas generation step and the group-III oxide gas supply step causes an increase in the oxygen concentration of the group-III nitride crystal. Therefore, oxygen can be prevented from mixing into the crystal by reacting the oxide gas other than the Ga source with the oxidizable gas before reaching the seed substrate 116. For example, if In gas is used as the oxidizable gas and reacted with H$_2$O that is the oxide gas other than the Ga source, the In gas reacts with the H$_2$O gas to generate In$_2$O gas and H$_2$ gas. The In$_2$O gas is extremely hardly taken into a solid at a growth temperature exceeding 1000° C. as in the manufacturing method of the group-III nitride crystal according to the first embodiment.

The unreacted group-III oxide gas, nitrogen element-containing gas, oxidizable gas, and carrier gas are discharged from the exhaust port 119 (the residual gas discharge step).

In this manufacturing method of the group-III nitride substrate, a GaN layer is grown by the OVPE method using a group-III element oxide gas as a raw material. This can achieve a growth mode of forming pits made up of the {11-22} plane (first regions) and the {10-11} plane (third regions), which are facet planes oblique to the c-plane of the GaN layer, on the entire surface of the substrate. As a result, as the grown GaN layer becomes thicker, dislocations are swept up together, so that the dislocation density can be reduced. As described above, the thickness of the grown GaN layer is preferably 200 μm or more. On the other hand, since the GaN layer is grown by the OVPE method (oxide vapor phase epitaxy method), a high oxygen concentration in the latter half of the order of $10^{20}/cm^2$ can be achieved in the plane of the GaN layer.

Example 1

In FIG. 19, for the reactive gas and the first carrier gas supplied from a line 1 to the raw material chamber 100, $H_2$ gas, $N_2$ gas, and $O_2$ gas were used at 4 L/min, 1 L/min, and 0.02 L/min, respectively. For the second carrier gas supplied from a line 2 to the growth chamber 111, $H_2$ gas and $N_2$ gas were used at 2.5 L/min and 2.5 Lmin, respectively. For the nitrogen element-containing gas supplied from a line 3 to the growth chamber 111, $H_2$ gas, $N_2$ gas, $N_2$ gas, and $NH_3$ gas were used at 0 L/min, 2.5 L/min, 13 to 14 L/min, and 1 to 2 L/min, respectively. For the second carrier gas supplied from a line 4 to the growth chamber 111, $H_2$ gas and $N_2$ gas were used at 12.5 L/min and 12.5 L/min, respectively.

The temperature of the raw material chamber 100 was 1130° C., and the temperature of the growth chamber 111 was 1200° C. The heating method was resistance heating. The atmosphere in the growth chamber 111 was set to the atmospheric pressure, and the growth time was 460 minutes.

According to the group-III nitride substrate of Example 1, the GaN layer 2 grown by the OVPE method (oxide vapor phase epitaxy method) is disposed on the seed substrate 1, so that the dislocation density can be reduced by about two orders of magnitude as compared to the seed substrate 1.

The present disclosure includes appropriately combining any embodiments and/or examples out of the various embodiments and/or examples described above, and the effects of the respective embodiments and/or examples can be produced.

The group-III nitride substrate of the present invention has low dislocation and low resistance and can suppress occurrence of leakage in the second region having a high dislocation density at the time of device formation, thereby improving a dielectric strength voltage.

EXPLANATIONS OF LETTERS OR NUMERALS 1 seed substrate
2 growth layer
3 etch pit
10 group-III nitride substrate
11 first region
12 second region
13 third region
20 analysis range
100 raw material chamber
101 raw material reaction chamber
102 first carrier gas supply port
103 reactive gas supply pipe
104 raw material boat
105 starting Ga source (starting group-III element source)
106 first heater
107 group-III oxide discharge port
108 group-III oxide gas and carrier gas discharge port
109 connection pipe
110 third heater
111 growth chamber
112 nitrogen element-containing gas supply port
113 oxidizable gas supply port
114 second carrier gas supply port
115 second heater
116 seed substrate
117 substrate susceptor
118 group-III oxide gas and carrier gas supply port
119 exhaust port
150 manufacturing apparatus of group-III nitride substrate

What is claimed is:

1. A group-III nitride substrate, comprising:
   a first region having a first impurity concentration in a polished surface;
   a second region having a second impurity concentration lower than the first impurity concentration in the polished surface; and
   a third region having a third impurity concentration lower than the second impurity concentration,
   wherein the first region and the third region are alternately arranged circumferentially in a plurality around the second region,
   wherein the first regions and the third regions extend radially around the second region,
   wherein the first regions and the third regions directly contact the second region, and
   wherein a first dislocation density of the first region is lower than a second dislocation density of the second region.

2. The group-III nitride substrate according to claim 1, wherein the first region has a shape having a width that narrows toward the second region.

3. The group-III nitride substrate according to claim 1, wherein an impurity contained in the first region is at least one selected from the group consisting of oxygen and silicon.

4. The group-III nitride substrate according to claim 1, wherein the first impurity concentration is an oxygen concentration of $1 \times 10^{20}/cm^3$ or more.

5. A device comprising:
   the group-III nitride substrate according to claim 1; and
   a device structure formed on the group-III nitride substrate.

* * * * *